(12) United States Patent
Scott

(10) Patent No.: US 8,502,271 B2
(45) Date of Patent: Aug. 6, 2013

(54) BARRIER PHOTODETECTOR WITH PLANAR TOP LAYER

(75) Inventor: Jeffrey Winfield Scott, Santa Barbara, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 316 days.

(21) Appl. No.: 12/910,655

(22) Filed: Oct. 22, 2010

(65) Prior Publication Data
US 2011/0095334 A1    Apr. 28, 2011

Related U.S. Application Data

(60) Provisional application No. 61/254,480, filed on Oct. 23, 2009, provisional application No. 61/295,518, filed on Jan. 15, 2010.

(51) Int. Cl.
*H01L 31/102* (2006.01)

(52) U.S. Cl.
USPC .......................................................... 257/188

(58) Field of Classification Search
USPC .......................................................... 257/188
See application file for complete search history.

(56) References Cited

U.S. PATENT DOCUMENTS

| | | | |
|---|---|---|---|
| 4,679,063 A | 7/1987 | White | |
| 4,682,196 A | 7/1987 | Sakai et al. | |
| 4,731,640 A | 3/1988 | Bluzer | |
| 5,101,254 A | 3/1992 | Hamana | |
| 6,380,604 B1 | 4/2002 | Shima | |
| 7,592,654 B2 * | 9/2009 | Bahl et al. | 257/291 |
| 7,687,871 B2 | 3/2010 | Maimon | |
| 2002/0027238 A1 | 3/2002 | Lin et al. | |
| 2002/0070389 A1 | 6/2002 | Song | |
| 2006/0108528 A1 | 5/2006 | Qiu | |
| 2006/0118894 A1 | 6/2006 | Cohen et al. | |
| 2006/0267007 A1 | 11/2006 | Salzman et al. | |
| 2007/0215900 A1 | 9/2007 | Maimon | |
| 2008/0111152 A1 * | 5/2008 | Scott et al. | 257/188 |

FOREIGN PATENT DOCUMENTS

WO    WO 2005/004243 A1    1/2005

OTHER PUBLICATIONS

Chen et al. "Band structures of HgCdTe and HgZnTe alloys and superlattices". Semicond. Sci. Technol. 5 (1990) S100-S102.
Landau et al. Quantum Mechanics, Butterworth-Heinermann; 3 edition (Jan. 1, 1981), ISBN-13: 978-0750635394.
Maimon and Wicks, Abstract Book of 11th International Conference on Narrow Gap Semiconductors, Jun. 2003, Buffalo, N.Y.

* cited by examiner

*Primary Examiner* — Shaun Campbell
(74) *Attorney, Agent, or Firm* — Birch, Stewart, Kolasch & Birch, LLP

(57) ABSTRACT

A barrier-type photo-detector is provided with a Barrier between first and second layers. One of the layers is delineated into pixels without fully removing the non-pixel portions of the delineated layer. Delineation may be accomplished through material modification techniques such as ion damage, selective doping, ion induced disordering or layer material growth. Some variations may employ partial material removal techniques.

20 Claims, 22 Drawing Sheets

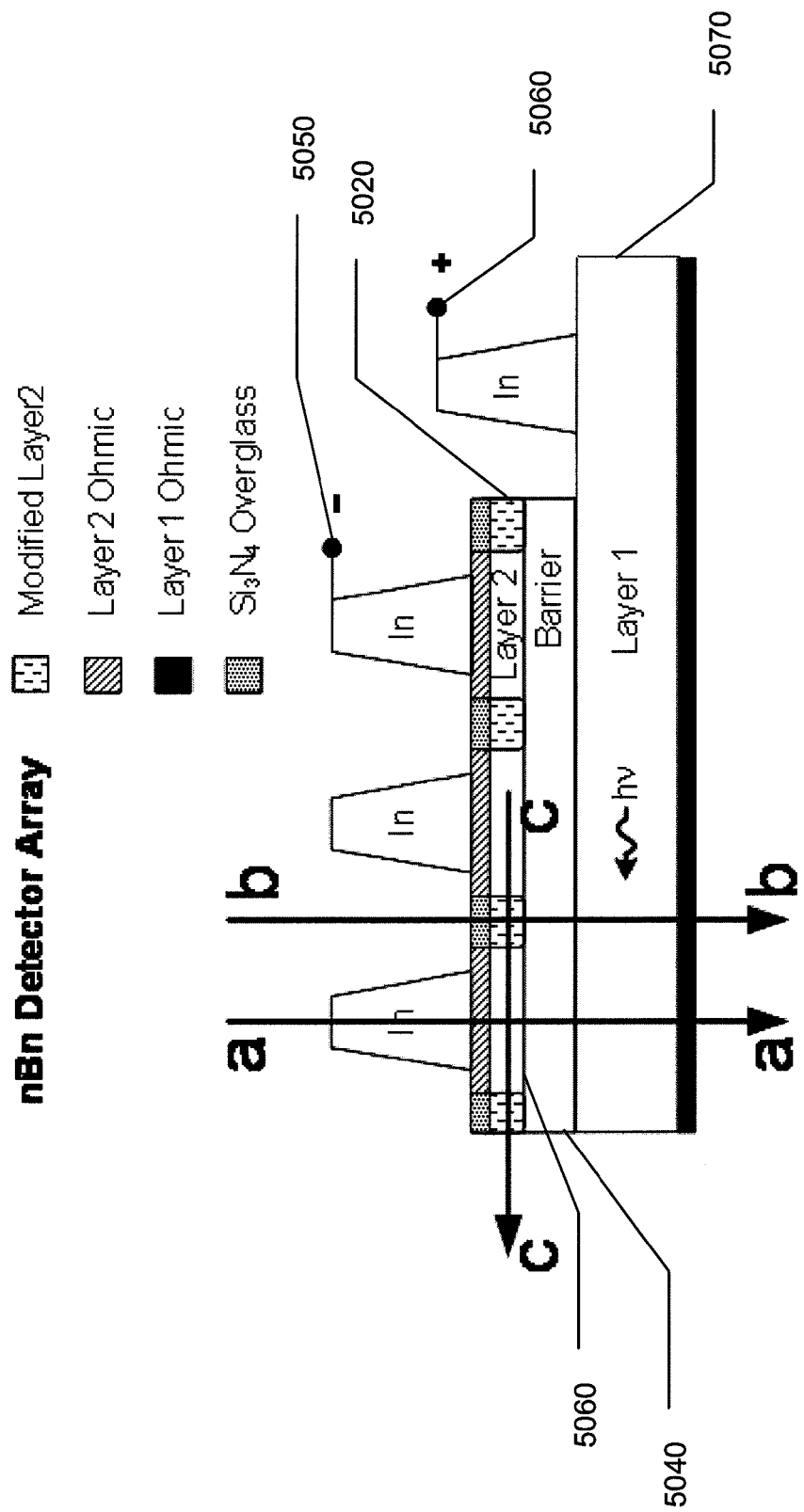

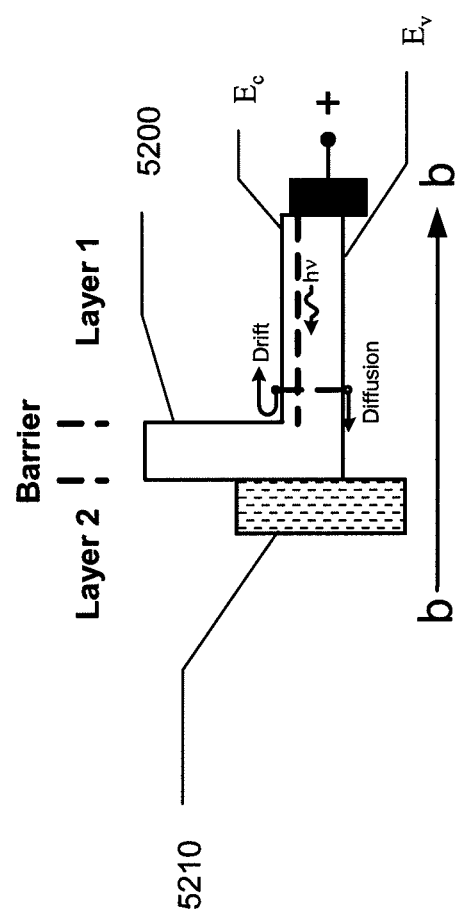

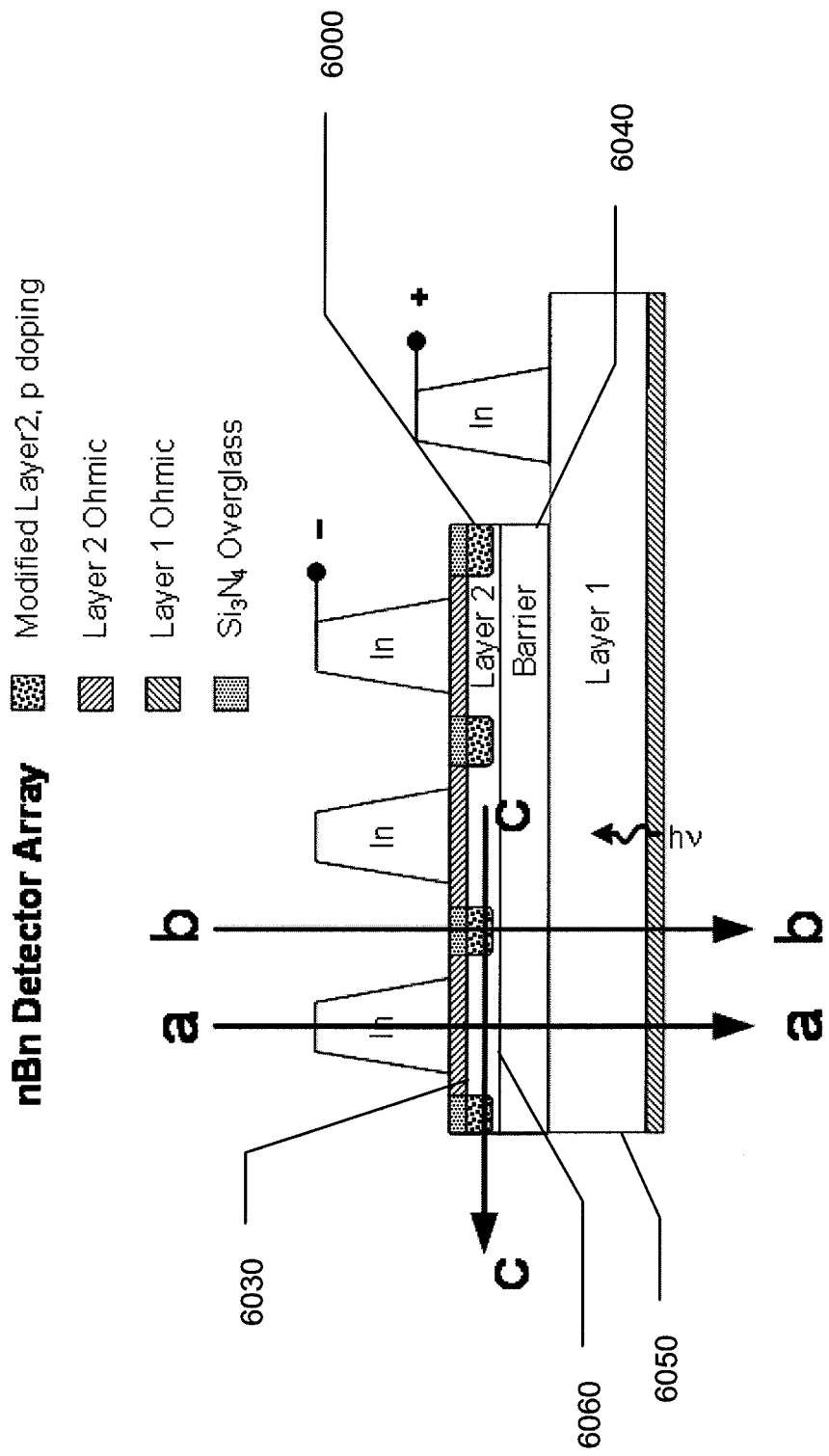

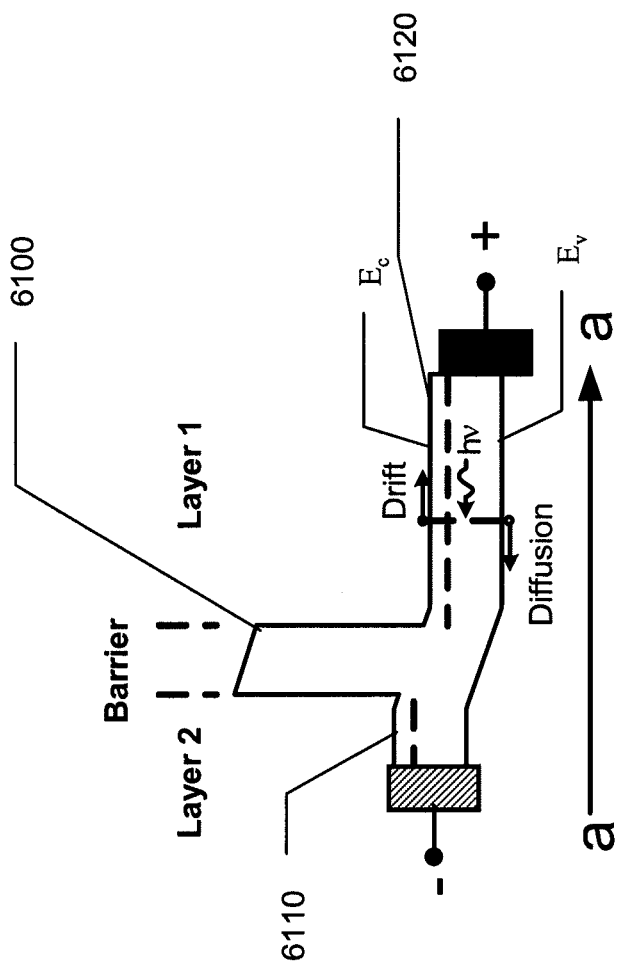

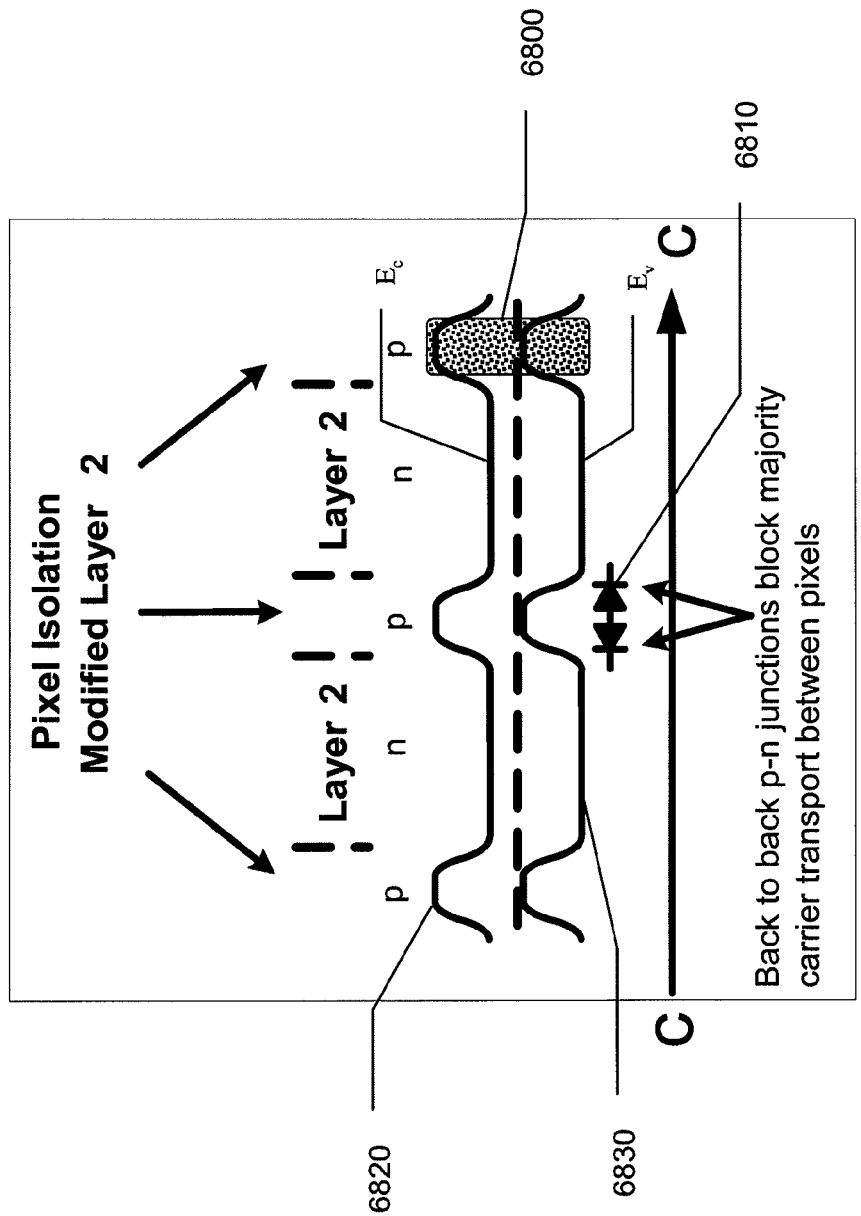

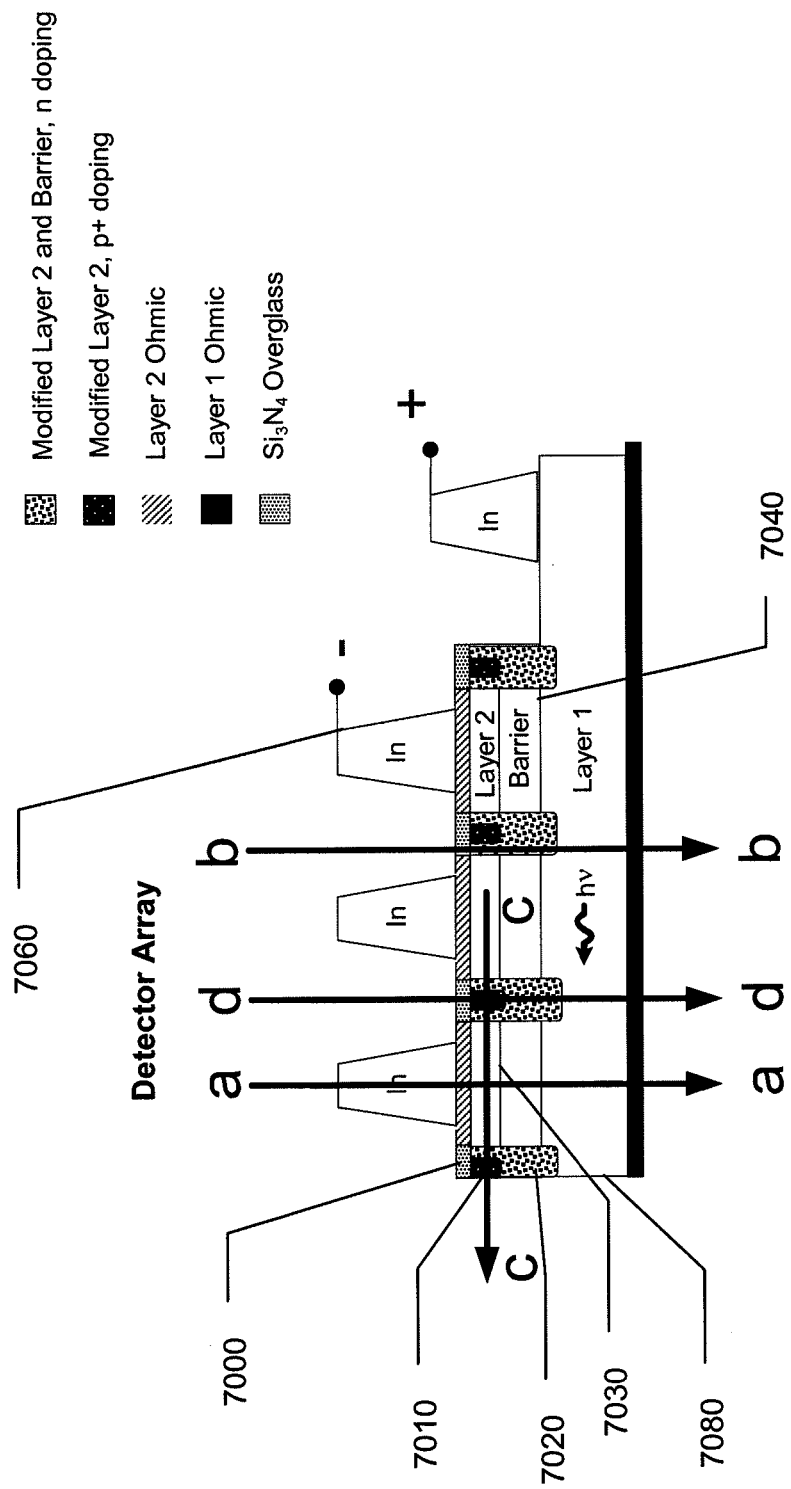

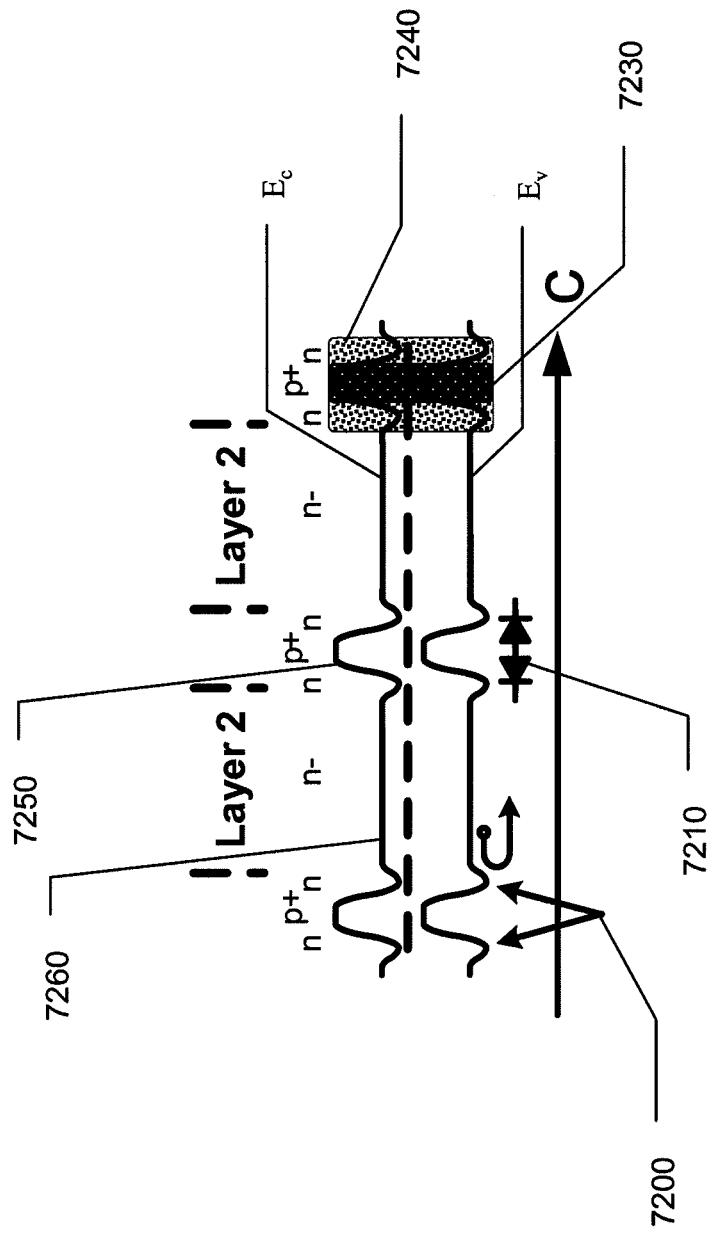

BARRIER PHOTODETECTOR WITH PLANAR TOP LAYER

PRIORITY

The present invention claims benefit of priority to U.S. Provisional Application No. 61/254,480, filed in the U.S. Patent and Trademark Office on Oct. 23, 2009 and also to U.S. Provisional Application No. 61/295,518, filed in the U.S. Patent and Trademark Office on Jan. 15, 2010, the entire contents of which are hereby incorporated by reference.

TECHNICAL FIELD OF THE INVENTION

The present invention relates to barrier-type photo-detectors including the structures disclosed in U.S. patent application Ser. No. 11/276,962, filed on Mar. 19, 2006 and issued as U.S. Pat. No. 7,687,871 on Mar. 30, 2010, the entire contents of which are hereby incorporated by reference. The present invention also relates to the composition, structure, and production thereof of barrier-type photo-detectors.

BACKGROUND OF THE INVENTION

This disclosure pertains to a reduced dark current Barrier-type photo detector that is comprised of a first semiconductor layer, a barrier, and a second semiconductor layer where at least one of the semiconductor layers is used for photo-absorption and the effective conduction and valance band alignments for the two layers and Barrier are arranged so as to allow photo-generated minority carrier flow but filter or block majority carrier flow. Individual elements in the photo detector array may be defined by isolating active regions in the first or second layer such that these regions form the pixels. The Barrier, however, may be preserved such that it extends beyond the extent of the isolated pixel areas. Although applicable to a wide range of barrier-type photodetectors, the exemplary embodiments and associated energy band diagrams presented in this disclosure depict an nBn Barrier type photodetector. The structures and methods discussed herein, however apply as well to nBn, pBp, nBp and pBn structures.

An embodiment of an exemplary nBn structure electron band diagram is illustrated in FIG. 1. The embodiment represents an embodiment of the concepts described in U.S. patent application Ser. No. 11/276,962. The underlying concept relates to driving minority carriers from a photo absorbing layer 1000 to a contact region 1020 through a Barrier 1010 where the compositions of the absorber, barrier, and contact layers are such that minority carriers can penetrate the Barrier 1010 but majority carriers cannot. As can be seen in FIG. 2 and as discussed in U.S. patent application Ser. No. 11/276, 962, the pixels in the contact layer 2030 are isolated by etching down to, but not through, the Barrier 2010 in order to accomplish pixel delineation. In the embodiment shown, each pixel is associated with an ohmic contact 2040 and a read-out interconnect point 2080. Minority carriers generated in the absorber layer 2000 pass through the Barrier 2010 and into the contact layer 2030 where they are read-out through the interconnect 2080 via the ohmic contact 2040.

It would be an improvement in terms of manufacturability, reliability, versatility and production yield to delineate and isolate pixels in such a photo-detector in ways other than material removal.

SUMMARY OF THE INVENTION

Aspects of the present disclosure are directed at barrier-type photo-detectors, non-etched and/or partially etched contact layers having delineated pixel regions, Barrier interface grading for dark current reduction, and two-color operation of barrier-type photo-detectors.

Embodiments discussed herein may pertain to photo-detectors with a reduced dark current. Embodiments of such detectors may have a first layer having predetermined majority and minority carrier types with corresponding energy bands; a semiconductor or semiconductor-bearing Barrier with a Barrier energy gap and corresponding conduction and valence bands; and a second layer having the predetermined majority and minority carrier types with a second layer energy gap. The layers are preferably stacked or arranged such that the Barrier is sandwiched between the first and second layers.

In some embodiments, the Barrier conduction and valance band edges are aligned with respect to the first and second layer energy bands so as to allow minority carrier current flow while blocking majority carrier current flow between the first and second layers. In further embodiments, at least one of the layers is delineated into pixels in a manner that leaves at least part of the Barrier as a physically continuous layer that extends beyond at least one of the delineated pixels. In some embodiments, delineation may be accomplished by creating non-pixel regions that separate the pixel regions or by creating distinct pixel regions and leaving the rest of the delineated layer as intervening non-pixel regions. The non-pixel regions preferably impede lateral carrier flow between pixels (to reduce or eliminate crosstalk). In some embodiments, the non-pixel regions contain material from the delineated layer, meaning that the non-pixel regions are modified or otherwise non-carrier-transporting portions of the delineated layer as opposed to simply being layer portions that are etched away or otherwise removed.

Some embodiments may pertain to photo-detector comprising a first layer having predetermined majority and minority carrier types with corresponding energy bands. Such embodiments also include a Barrier comprising a semiconductor with a Barrier energy gap and corresponding conduction and valence bands, where a first side of the Barrier is adjacent a first side of the first layer. Such embodiments also include a second layer having the predetermined majority and minority carrier types with a second layer energy gap, the second layer being adjacent a second side of the Barrier opposing the first side.

In such embodiments the Barrier conduction and valance band edges are aligned with respect to the first and second layer energy bands so as to allow minority carrier current flow while blocking majority carrier current flow between the first and second layers. The second layer is delineated into pixel regions and non-pixel regions that separate the pixel regions from each-other while leaving at least part of the Barrier as a physically continuous layer such that the first side of said Barrier laterally extends beyond at least one pixel region. In such an embodiment, the non-pixel regions of the second layer impede carrier current flow between pixels and also include layer material adjacent to the Barrier. In some variations of such embodiments, the first layer acts as a photo-absorbing layer and the second layer acts as a contact layer during operation with a bias voltage. In other variations, where the bias voltage is reversed, the contact and photo-absorbing roles of the layers are also reversed.

In some embodiments, the non-pixel regions are ion-damaged regions. In such embodiments, the ion damage prevents carrier transport through the non-pixel regions. In some variations within such embodiments, the ion-damaged regions may also prevent lateral carrier movement across/between pixel regions. In other embodiments, the pixel regions include ion-damaged portions (such as ion-damaged semiconductor material). In such embodiments, the ion damage imparts electrically conductive and carrier-bearing properties to the pixel regions.

In some embodiments, the delineated layer is the second layer. In some variations within such embodiments, the non-pixel modified regions extend fully through the second layer such that the non-pixel modified regions are in contact with the Barrier. In further variations, second layer material may be partially removed from the non-pixel regions.

In some embodiments, the non-pixel regions are doped regions of a first doping type and the pixel regions are doped regions of a second doping type. The interface of the pixel and non-pixel regions in such embodiments will form a junction. In some variations within such embodiments, the junction may be a p-n junction which creates a carrier-blocking depletion region.

In some variations the junction and/or the depletion region may prevent one or both of minority carrier transport through the Barrier or lateral carrier transport between pixel regions. In further variations, non-pixel regions may only extend partially through the second layer such that the non-pixel region modifications are not in contact with the Barrier. In yet further variations, the non-pixel region may be p-doped and the pixel region may be n-doped. In other variations, the pixel region may be p-doped and the non-pixel region n-doped. In such variations, a p-n junction with an associated depletion region may be formed at the pixel region/non-pixel region interface, thereby blocking lateral current flow and isolating pixels.

In some embodiments, the Barrier is graded at the layer interfaces. In other embodiments, one or both of the layers may be graded at their barrier interfaces. In yet further embodiments, both the Barrier and a layer may be graded at a barrier/layer interface. In such embodiments, the grading may be accomplished to create a material transition from the layer to the Barrier that allows for minority carrier transport through the Barrier without carrier recombination due to trapping at the interface.

In further embodiments, the barrier valence band may be slightly mismatched with respect to the layer 1 energy band. Such a valence mismatch may reduce carrier recombination at the Barrier/layer interface by impeding transport of minority carriers across the Barrier into the non-pixel region.

In some embodiments, the non-pixel regions are composite regions having an outer shell doped one way and an inner plug doped another way. In some variations of such embodiments, the outer shell extends from the delineated layer, through the Barrier, and into the non-delineated layer.

In some embodiments where the delineated layer is the second layer, the second layer may be n-doped, the outer shell of a non-pixel region may be n doped, and the inner plug may be p doped. Variations of such embodiments may use alternate doping strategies such as n, n+ and p, p−, p, and n, or other suitable approaches that create a homojunction between the shell and the pixel region and a p-n junction between the shell and the plug. In some variations, depletion regions may be created at either or both of the homojunction or the heterojunction. In some variations, the p-n junction and/or its associated depletion region may prevent lateral carrier transport between pixel regions. In further variations, the outer shell may create a localized depletion region in the non-delineated layer at an interface of the shell she the non-delineated layer. Such a localized depletion region may prevent transport of minority carriers vertically through the Barrier and laterally into the non-pixel regions.

In some embodiments, operation may be realized by reversing the polarity of the bias voltage applied to the detector. In such an embodiment, when the bias voltage is reversed the delineated layer acts as the photo-absorbing layer and the non-delineated layer acts as the contact layer during operation. In addition, both layers can be utilized as photo-absorbing, In addition such embodiments may be configured so that the bandgap of the delineated layer is different from the bandgap of the non-delineated layer, thereby enabling 2-color operation through bias voltage reversal.

In some variations, a forward voltage bias or a reverse voltage bias is applied to the photo-detector during operation. In such variations, the first layer acts as a photo-absorber and the second layer acts as a contact layer under the forward bias and the second layer acts as the photo-absorber and the first layer acts as the contact layer under the reverse bias.

In further variations, the first layer has a first band-gap associated with a first spectral band and the second layer has a second band-gap associated with a second spectral band such that the first spectral band is detected during forward bias operation and the second spectral band is detected during reverse bias operation.

In yet further variations, the first band-gap is larger than the second band-gap and the photo-detector is configured in a backside illuminated mode providing two-color operation. In further variations still, the second band-gap is larger than the first band-gap and the photo-detector is configured in a frontside illuminated mode providing two-color operation.

Further scope of applicability of the present invention will become apparent from the detailed description given hereinafter. However, it should be understood that the detailed description and specific examples, while indicating preferred variations of the invention, are given by way of illustration only, since various changes and modifications within the spirit and scope of the invention will become apparent to those skilled in the art from this detailed description.

BRIEF DESCRIPTION OF DRAWINGS

The present invention will become more fully understood from the detailed description given herein below and the accompanying drawings which are given by way of illustration only, and thus are not limitative of the present invention, and wherein:

FIG. 5a shows an embodiment of a barrier-type photo-detection array with pixels delineated by layer material modification;

FIG. 5c shows an energy-band diagram in a non-pixel region of a barrier-type photo-detector;

FIG. 6a shows an embodiment of a barrier-type photo-detection array with pixels delineated by layer material modification;

FIG. 6b shows an energy-band diagram in a pixel region of a barrier-type photo-detector;

FIG. 6i shows an energy-band diagram between pixel regions of a barrier-type photo-detector;

FIG. 7a shows an embodiment of a barrier-type photo-detection array with pixels delineated by layer material modification;

FIG. 7c shows an energy-band diagram between pixel regions of a barrier-type photo-detector;

The drawings will be described in detail in the course of the detailed description of the invention.

DETAILED DESCRIPTION OF THE INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

Figure 3:
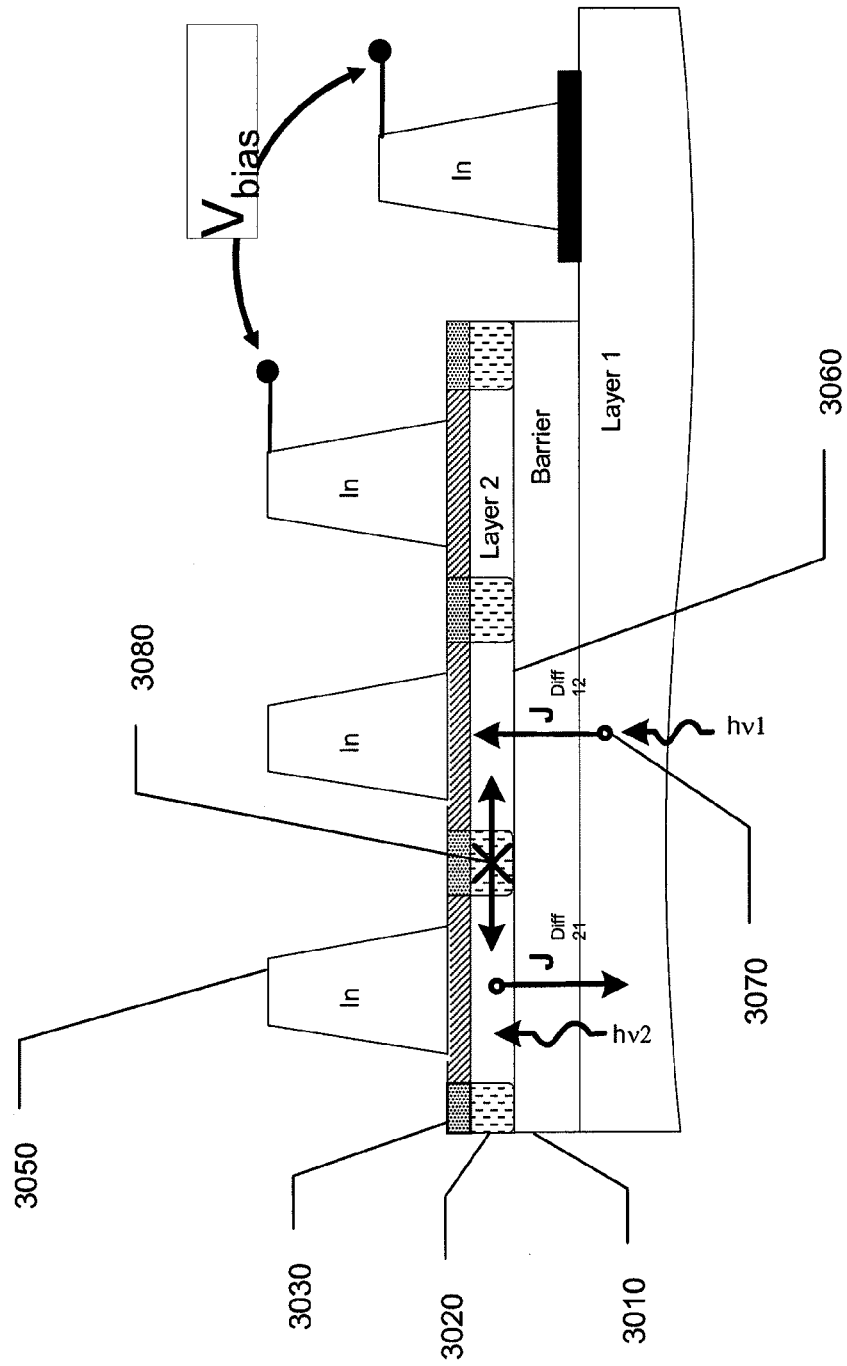
FIG. 3 shows an embodiment of a barrier-type photo-detection array with pixels delineated by layer material modification.

Improved reliability, radiation hardness, manufacturability, cost savings, and improved production yields can be realized by modifying portions of the second layer in ways other than material removal to accomplish pixel isolation. Further benefits of such non-removal-based modification include reduced surface states in the layer, which lead to improved reliability, radiation hardness and/or enhanced two-color operation (which can be accomplished through voltage bias reversal). The second layer delineation, according to the teachings of the present application, can be formed by patterned diffusion, ion damage, or ion implantation and annealing. An example of a structure with a non-etched delineated second layer having isolated pixels is illustrated in FIG. 3. Any suitable method for layer modification 3020, 3030 may be used as long as such methods effectively suppress majority carrier lateral transport 3080 in the modified layer while allowing vertical minority carrier transport 3070 from the Barrier 3010, through the un-modified portion of layer 2 3060 forming the individual pixel regions to the pixel interconnect 3050. In addition, it may be advantageous to prevent later transport of minority carriers into the non-pixel regions.

Figure 1:
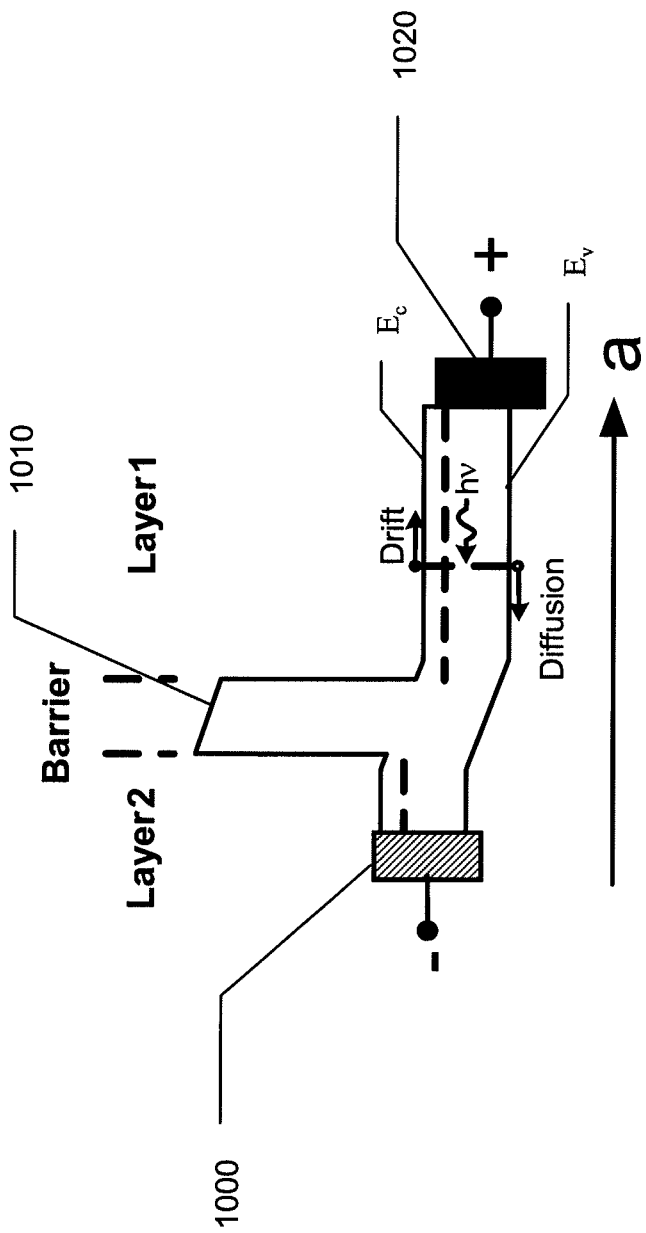
FIG. 1 shows an energy-band diagram in a barrier-type photo-detector.

Delineated pixel regions 3060 of layer 2 of the type illustrated in FIG. 3 can be accomplished by selectively doping specific regions of layer 2 so that they function as blocking regions 3020, 3030 between the individually delineated pixel regions 3060 of layer 2 while leaving the rest of the layer area undisturbed. Such modified portions of the second layer can be n-doped or p-doped or combinations thereof, depending on the particular Barrier and active layer arrangement selected. The semiconductor materials can be composed of a wide range of semiconductors including Si, InAs, GaSb, GaAs, InSb, AlAs, AlSb, HgCdTe, InAsSb, InAsGaSb or any other suitable materials or material combinations that supply the valance and conduction band relationships for passing minority carriers or blocking or suppressing the flow of majority carriers through the barrier. These materials can be formed of suitable amorphous, lattice, digital alloy, or superlattice configurations. Further improvements in material properties can also be gained through the incorporation of Bi, N, or other materials to the above-listed semiconductors (or combinations thereof). Such alterations in material properties and strain can change the bandgap or conduction or valence band alignments to achieve a desired valence and conduction band configuration such as contemplated in FIG. 1

Embodiments of Barriers 3010 can be constructed of uniform alloys, superlattices, digital alloys, strain compensation layering or other bandgap-engineered structures. Desirably, the effective conductance and valance band alignments allow the flow of photo-generated minority carriers but block the flow of majority carriers.

In the embodiment depicted in FIG. 3, the pixel interconnects 3050 are conventional Indium type common for infrared focal plane arrays. Alternate embodiments can employ a wide range of interconnect methods in combination with embodiments of the present invention. Alternate interconnect embodiments may include methods developed using micro-electrical-mechanical-systems (MEMS) processing and other known methods developed for silicon integrated circuit interconnects.

Figure 4:
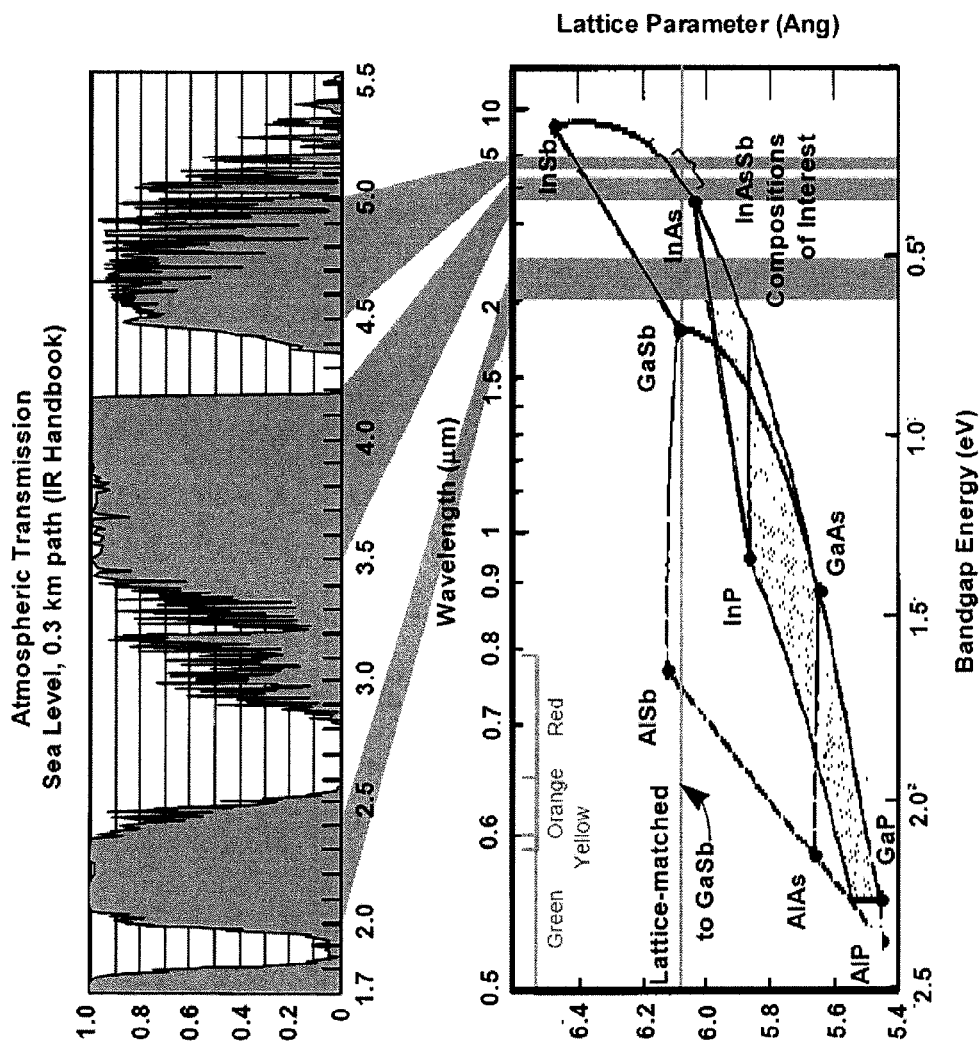
FIG. 4 shows an exemplary electro-optical radiation wavelength spectrum and the relationship with an exemplary compound semiconductor material system.

Further variations on the embodiments of the photodetector described above can include different types of semiconductor (barrier, layers 1,2) having different material combinations or doping types or concentrations. Such structural variations can allow for two-color photo-detection. In FIG. 3, two photons of different energy (or inversely wavelength) are shown. Layer 1 is composed of material with a larger bandgap (shorter wavelength) while layer 2 is composed of material with a smaller bandgap (longer wavelength.) In the case of backside illumination of this example the photons with shorter wavelengths will be detected when the bias voltage is applied to collect the minority carriers generated in layer 1 while photons of wavelengths longer than the cutoff of layer 2 but shorter than the cutoff of layer 2 will be detected when the bias voltage is reversed. In some embodiments, a bandgap of the photoabsorbing layer(s) can be designed to have a maximum cutoff wavelength that supports the absorption of electromagnetic radiation within the ultraviolet, visible, shortwave (SW), midwave (MW) or longwave (LW) atmospheric transmission bands as shown in FIG. 4. Strain can be introduced into an embodiment of a photo-detecting structure to favorably improve the energy band alignments. In embodiments where the Barrier is sufficient thin so as to not dislocate, often referred as beneath the critical thickness, the Barrier can be subjected to higher strain than in the first or second layers due to its thickness. Barrier embodiments can combine strain with layered materials to bandgap engineer the band alignment favorable to the carrier filtering function (passing minority carriers while blocking majority carriers).

In alternate embodiments, pixel delineation may be accomplished by growing layer 2 such that it is not vertically conducting and then using modifications in the pixel regions 3060 to selectively form isolated pixels. In such an embodiment, layer 2 is grown in its entirety as a blocking region 3020, with specific pixel areas delineated by modification (such as selective doping, diffusion or disordering) of the pixel region 3060 rather than the creation of blocking areas in a vertically conducting layer 2. Growth techniques may include variations or combinations of silicon growth techniques currently known to those skilled in the art.

Figure 2:
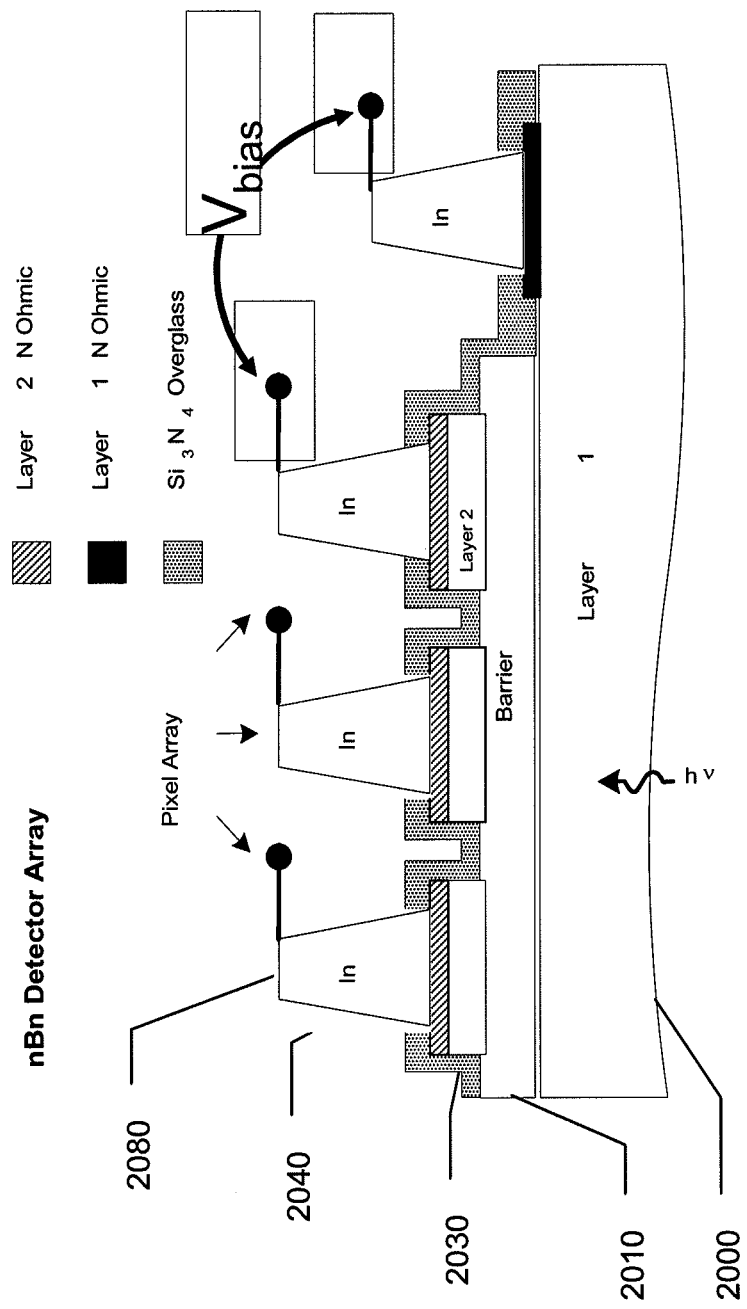
FIG. 2 shows an embodiment of a barrier-type photo-detection array with pixels delineated by layer material removal.

By eliminating a material removal operation (such as etching) in the delineated layer, fabrication of a detector as disclosed herein can be simplified. Defects and opportunities for patterning error or contamination associated with etching operations can be eliminated. By eliminating exposure of etched surfaces on side walls of delineated pixels 2030 in layer 2 down to the barrier interface as shown in FIG. 2 surface recombination and surface dark current generation are further reduced, thereby allowing for further improvements in quantum efficiency, sensitivity and/or higher temperature operation.

Ion Damaged Embodiments

Figure 5B:
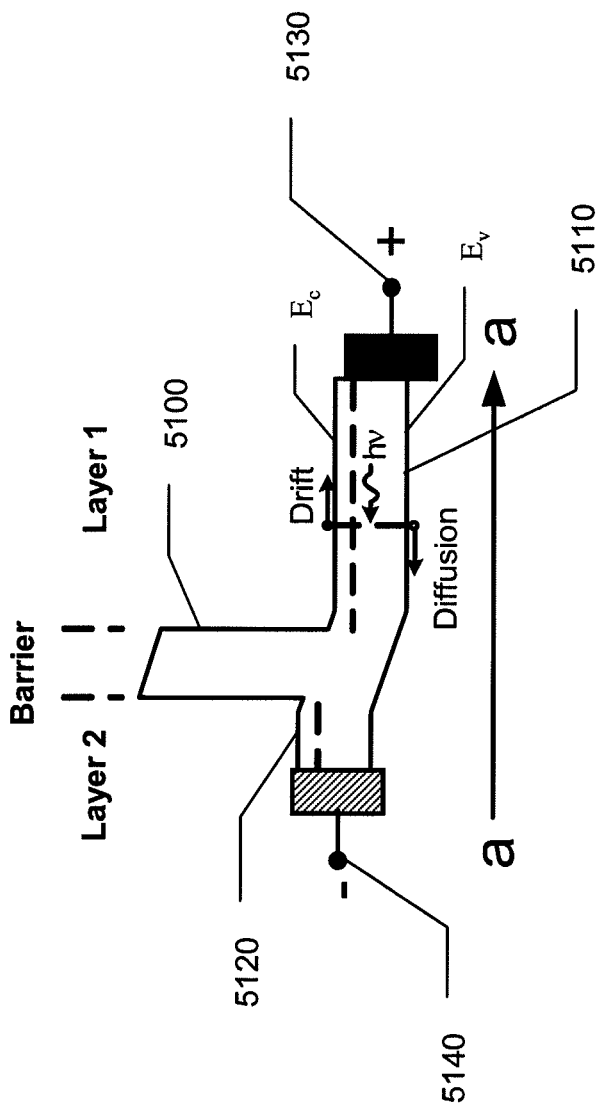
FIG. 5b shows an energy-band diagram in a pixel region of a barrier-type photo-detector.

The specific energy-band properties of a Barrier-type detector with a non-etched top layer having isolated pixel regions created by methods such as ion damage is explained with reference to the embodiment shown in FIG. 5a. FIG. 5a depicts an embodiment of a barrier-type photo-detector array having pixels delineated using ion damage, with section lines a-a, b-b, and c-c denoting the cross-sections having the energy band compositions of FIGS. 5b, 5c, and 5d.

In the embodiment depicted above, each of the section lines illustrated (a-a, b-b, and c-c) are associated with a distinct energy band arrangements resulting in different carrier transport. Section a-a exhibits an energy band configured for carrier transport through the Barrier 5040 for photo-detection in the pixel region 5060 of layer 2. Section b-b exhibits an energy band configured for blockage of vertical carrier transport in a carrier-blocking region 5020 of layer 2. Section c-c exhibits an energy band configured for blockage of carrier drift between pixels 5060 across blocking regions 5020 of layer 2. A voltage bias for operation is applied between the contact 5050 and absorber 5060 terminals. In some variations, voltage bias may be reversed so that layer 2 5060 becomes an absorber and layer 1 5070 becomes a contact layer.

Section a-a has the energy band properties shown in FIG. 5b. As can be seen from the diagram, a detector as discussed herein performs similarly to etched Barrier-type photodetectors along section a-a. The Barrier conduction $E_c$ and valence $E_v$ band alignments relative to layers 1 5110 and 2 5120 are designed to allow the flow of photo-generated minority carriers and block the flow of majority carriers. In embodiments having equal carrier types on both sides (nBn, pBp) the depletion zone can be minimized at low bias voltages, resulting in reduced dark current. This can be realized because suppression of majority carrier flow through the Barrier 5100 prevents these carriers from being depleted in the active layer(s) 5110, 5120. Furthermore, having the same carrier type on both sides can support operation in both directions by reversing the contact polarity and thereby enabling two-color operation. A reversal of the contact polarity (i.e. changing the voltage bias so that the anode 5130 becomes the cathode and the cathode 5140 becomes the anode) can reverse the flow of minority carriers, switching the roles of the photo-absorber 5110 and contact 5120 layers. Because the Barrier 5100 nonetheless blocks the flow of majority carriers regardless of flow direction, polarity reversal allows for embodiments of detectors that can use either layer 2 or layer 1 (which can have different wavelength sensitivities) as a photo-absorber. Yet further embodiments may be configured to alternate polarities, thereby allowing for collection of image data based on the photo-absorption properties of layer 1 and layer 2 (such as two-color operation).

In an embodiment as depicted in FIG. 5a, section b-b has the energy band properties shown in FIG. 5c. In the embodiment shown, the material in the blocking portions 5210 of layer 2 is non-conductive, thereby eliminating majority or minority carrier flow. These insulating portions 5210 delineate pixels without etching, and allow at least part of the Barrier 5200 to extend underneath as grown, maintaining the passivating properties of a wide bandgap material at the surface.

Figure 5D:
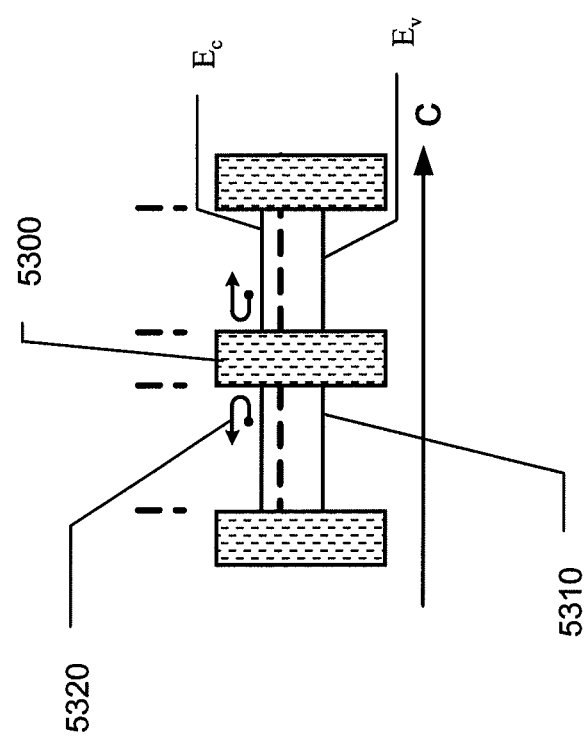
FIG. 5d shows an energy-band diagram between pixel regions of a barrier-type photo-detector.

Section line c-c has the energy band properties shown in the FIG. 5d. As can be seen in the diagram, the insulating portions 5300 block the lateral transport of majority carriers 5320 between delineated pixel regions 5310. It is advantageous to isolate the pixels so that current from one pixel does not combine or blend with its neighbors as this would produce a blurred image. Without pixel isolation, it would be effectively be one large pixel instead of a pixel array, relying on the lateral current spreading in layer 2 to define the image resolution.

As can be seen from the above diagrams, embodiments of a detector where pixels are isolated in the top layer due to ion damage block majority carrier flow and thereby reduce detector noise by virtue of the modified, ion-damaged regions. In other embodiments, ion-damage or ion damage and anneal producing ion-induced disordering may be used to give conductive qualities to intended pixel regions of an otherwise insulating layer 2. In yet further alternate embodiments, blocking junctions may be employed instead of, or in conjunction with, insulating material solutions for a non-etched top layer.

Blocking Junction Embodiments

An embodiment of a detector having a non-etched delineated layer created through blocking junctions (which can be created through ion implantation, diffusion, and similar methods) will be understood with reference to FIG. 6a, which depicts an embodiment of an nBn detector array having pixels 6030 delineated using blocking junctions 6000.

Each of the Sections illustrated above (a-a, b-b, and c-c) is a distinct carrier transport situation. Section a-a exhibits an energy band configured for carrier transport through the Barrier 6040 and into layer 2 6060 for photo-detection. Section b-b exhibits an energy band configured for the blockage of vertical carrier transport in a blocking portion 6000 of a non-etched delineated layer 6060. Section c-c exhibits an energy band configured for blockage of carrier transport between isolated pixels 6030 within a non-etched delineated layer 6060 according to the present invention.

FIG. 6b depicts an example of the energy band properties associated with vertical carrier transport in a pixel of an exemplary embodiment of a non-etched Barrier-type detector as depicted in FIG. 6a. The embodiment shown operates in a manner similar to that discussed with respect to FIG. 5b. As can be seen from the diagram, a detector as discussed herein performs similarly to etched Barrier-type photodetectors along section a-a. The Barrier conduction $E_c$ and valence $E_v$ band alignments relative to layers 1 6110 and 2 6120 are designed to allow the flow of photo-generated minority carriers and block the flow of majority carriers. In embodiments having equal carrier types on both sides (nBn, pBp) the depletion zone can be minimized at low bias voltages, resulting in reduced dark current. This is because the Fermi levels are nearly equal on both sides of the Barrier so that very little bias voltage difference is required to drive the transport. Also, as discussed previously, the voltage bias may be reversed, allowing for 2-color operation.

Figure 6C:
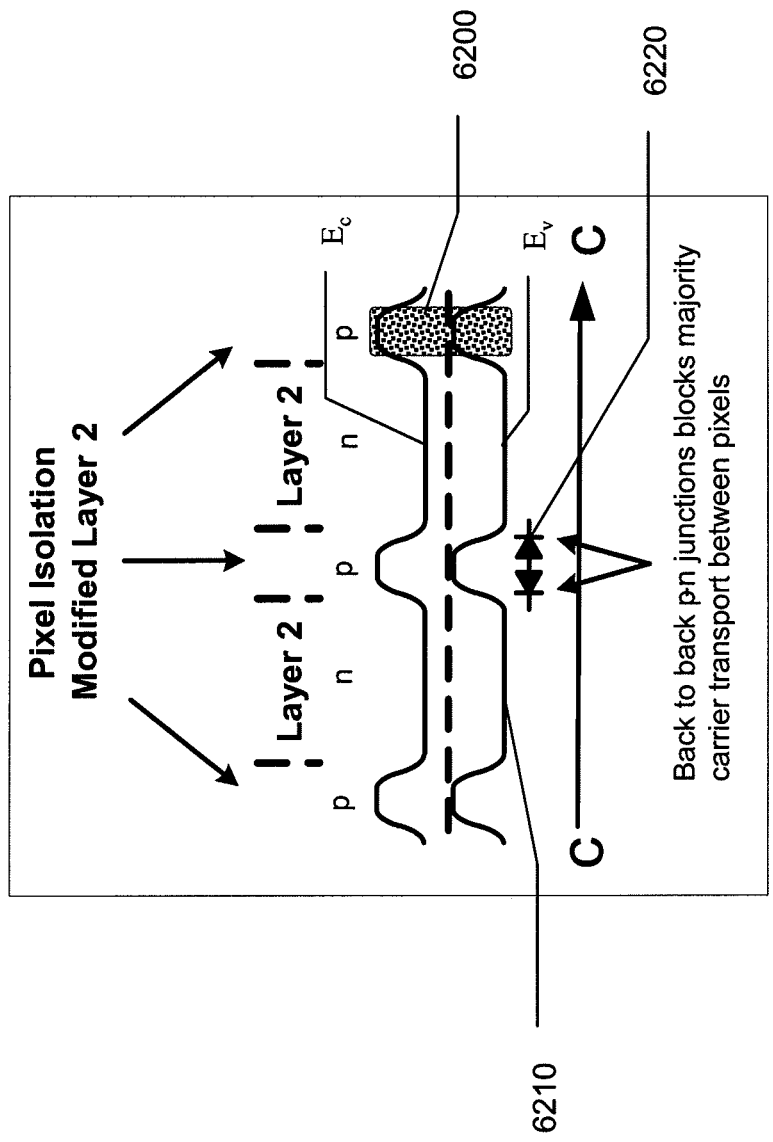
FIG. 6c shows an energy-band diagram transport between pixel regions of a barrier-type photo-detector.

With respect to inter-pixel carrier transport as it relates to the embodiment shown in FIG. 6a, the introduction of p-n junctions in layer 2 can prevent the lateral transport of majority carriers between delineated pixel regions along section c-c. A back-to-back diode structure between the pixels, shown in FIG. 6c, can be used as a current blocking configuration 6220. Any lateral voltage difference between pixels will be dropped across the diode with the rectifying polarity. Alternate embodiments can reverse the doping in layer 2 and employ n-doped blocking portions 6200 in a p-doped layer 6210 for the same effect. In either case, the back to back p-n junctions 6220, created by the introduction of activated doping, block the flow of carriers between pixels.

Figure 6D:
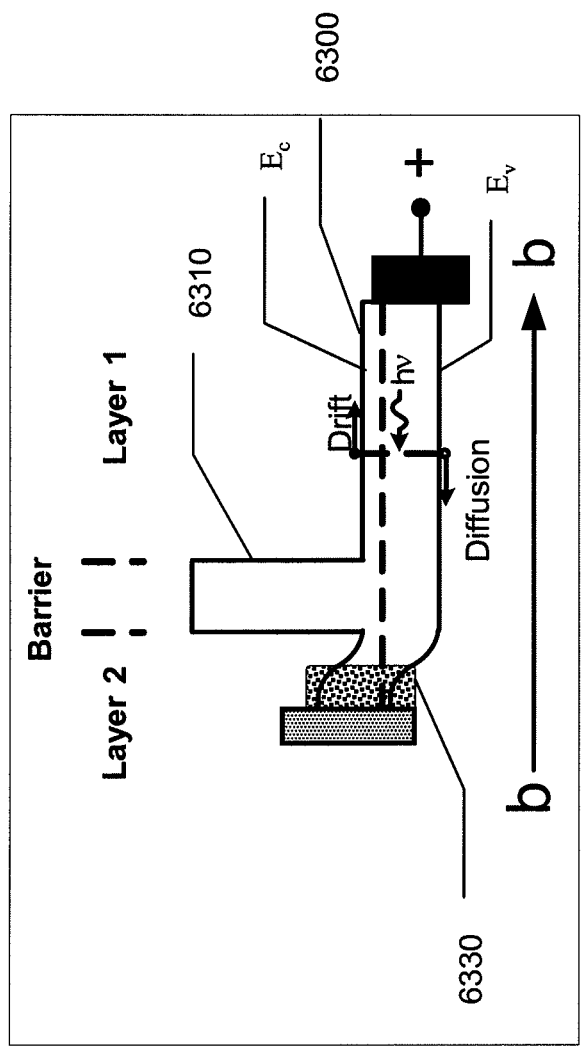
FIG. 6d shows a band an energy-band diagram in a non-pixel region of a barrier-type photo-detector.

In an embodiment as depicted in FIG. 6a, an energy band diagram for vertical minority-carrier transport along section b-b from layer 1 6050 into the current-blocking modified regions in layer 2 6000 is shown in FIG. 6d. In such an embodiment, minority carriers moving through the Barrier 6310 from layer 1 6300 can become trapped in the blocking regions 6330. Some embodiments of the type shown in FIG. 6a can reduce the collection of minority carriers in the modified regions by doping the modified regions such that the vertical depletion region in layer 2 6000 does not extend through the Barrier 6040 into layer 1 6050. An embodiment according to such a configuration is shown in FIG. 6d. In such an embodiment, if an additional reverse bias (negative voltage in the case of an nBn detector with p-type blocking layers as shown) is applied to contacts with the blocking region (not shown) carrier injection may be suppressed. In some instances, however, embodiments of such can also apply a bias across the lateral blocking p-n junctions shown in FIG. 6c, which may result in undesired leakage currents arising from material or processing defects.

Blocking Junction—Valence Mismatch Embodiments

Figure 6E:
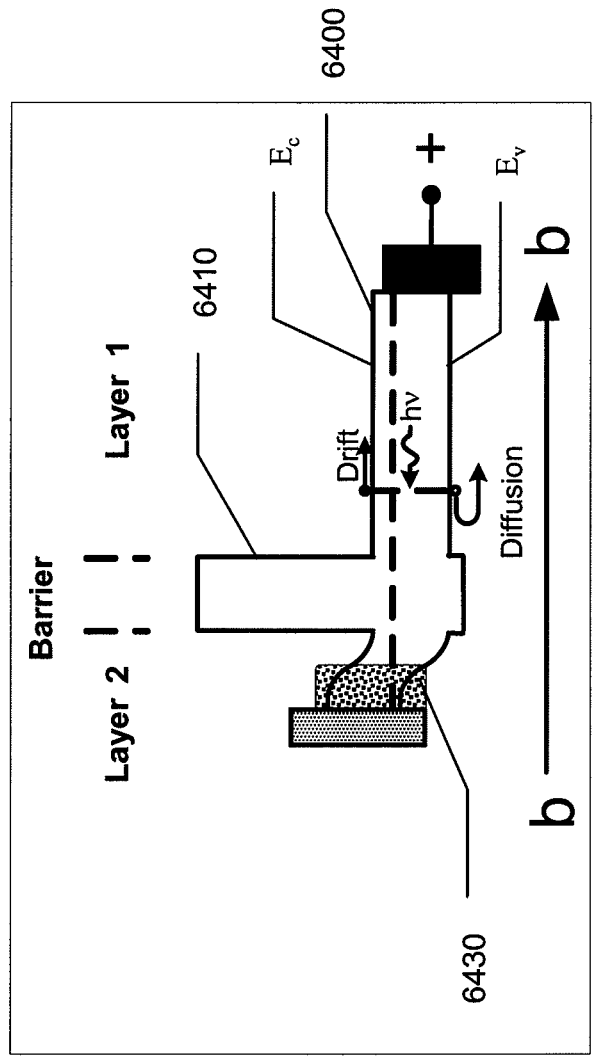
FIG. 6e shows an energy-band diagram with a valence-mismatched Barrier in a barrier-type photo-detector.

FIG. 6e depicts an energy band associated with alternate embodiment of a blocking junction, in which a minor valence band mismatch at the layer 1 6400 to Barrier 6410 interface can be introduced. Such mismatch can be introduced by varying the material compositions or introducing strain or a combination therof. In the embodiment shown, the energy band mismatch at the Barrier-to-layer interface are designed to require a small bias voltage for vertical transport and thus block the flow of minority carriers from layer 1 6400 across the Barrier 6410 into the blocking region of layer 2 6430, thereby suppressing the possibility of undesirable injection of photo-generated minority carriers into the modified regions in layer 2 6430. Such embodiments, however, may require a higher turn-on voltage and, in some cases, may exhibit undesirable charge storage effects at the Barrier interfaces.

Blocking Junction—Valence Mismatch—Graded Barrier Embodiments

In yet another embodiment of a blocking junction, the Barrier interfaces with the surrounding layers can be graded to provide blocking of minority carrier transport while avoiding charge trapping and undesirable carrier recombination at the Barrier interfaces Embodiments having graded interfaces can reduce the forward bias needed to extract photo-generated carriers while reducing or eliminating charge storing behavior. In some embodiments, grading of the Barrier composition at the absorber interface can reduce or eliminate notches, which can arise in ungraded interfaces, that may result in higher required bias voltages, charge storage effects, or reductions in quantum efficiency due to carrier recombination. Such embodiments may require higher turn-on voltage than the structure in FIG. 5c and may entail a more complex or involved growth process for the Barrier than the structure of FIG. 6e. An example of an energy band diagram associated with such an embodiment of a blocking junction is illustrated in FIG. 6f.

The energy band diagram depicted is associated with an embodiment of an nBn Barrier-type detector, illustrating a configuration of energy bands $E_c$, $E_v$ in the pixel isolation region for the case of minority carrier flow from Layer 1 6500 across the Barrier 6510 into the blocking junction of Layer 2 6530.

Figure 6F:
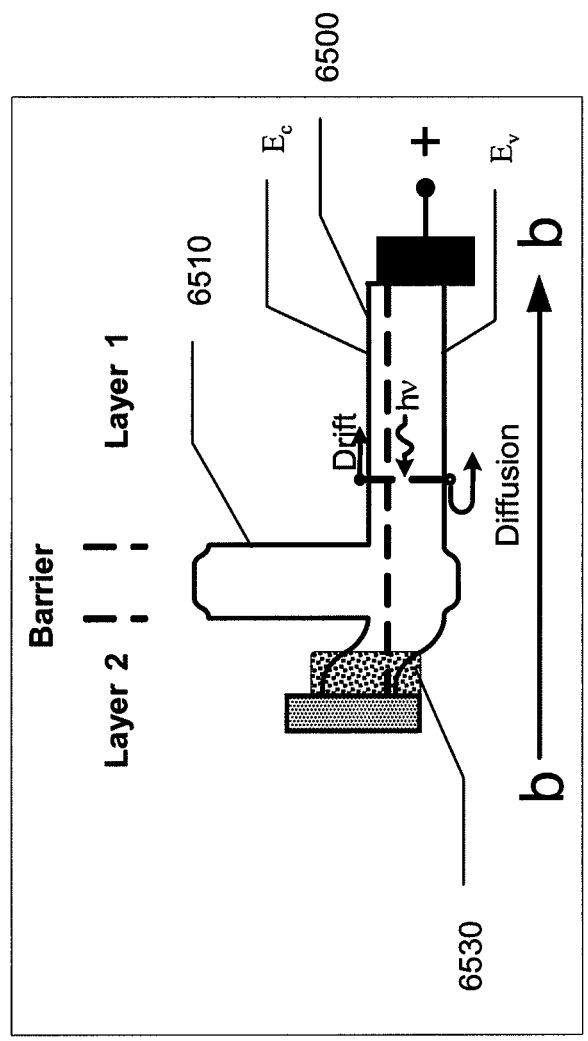
FIG. 6f shows an energy-band diagram with a graded Barrier in a barrier-type photo-detector.

As can be seen in FIG. 6f, embodiments of a graded Barrier 6510 can reduce or prevent diffusion of minority carriers into the blocking junction regions in layer 2 6530, thereby improving the collection of photo-generated minority carriers into the pixels. A comparison of embodiments of ungraded and graded Barrier structures in the un-modified pixel region for varying bias is shown in FIG. 6g and FIG. 6h respectively.

Figure 6G:
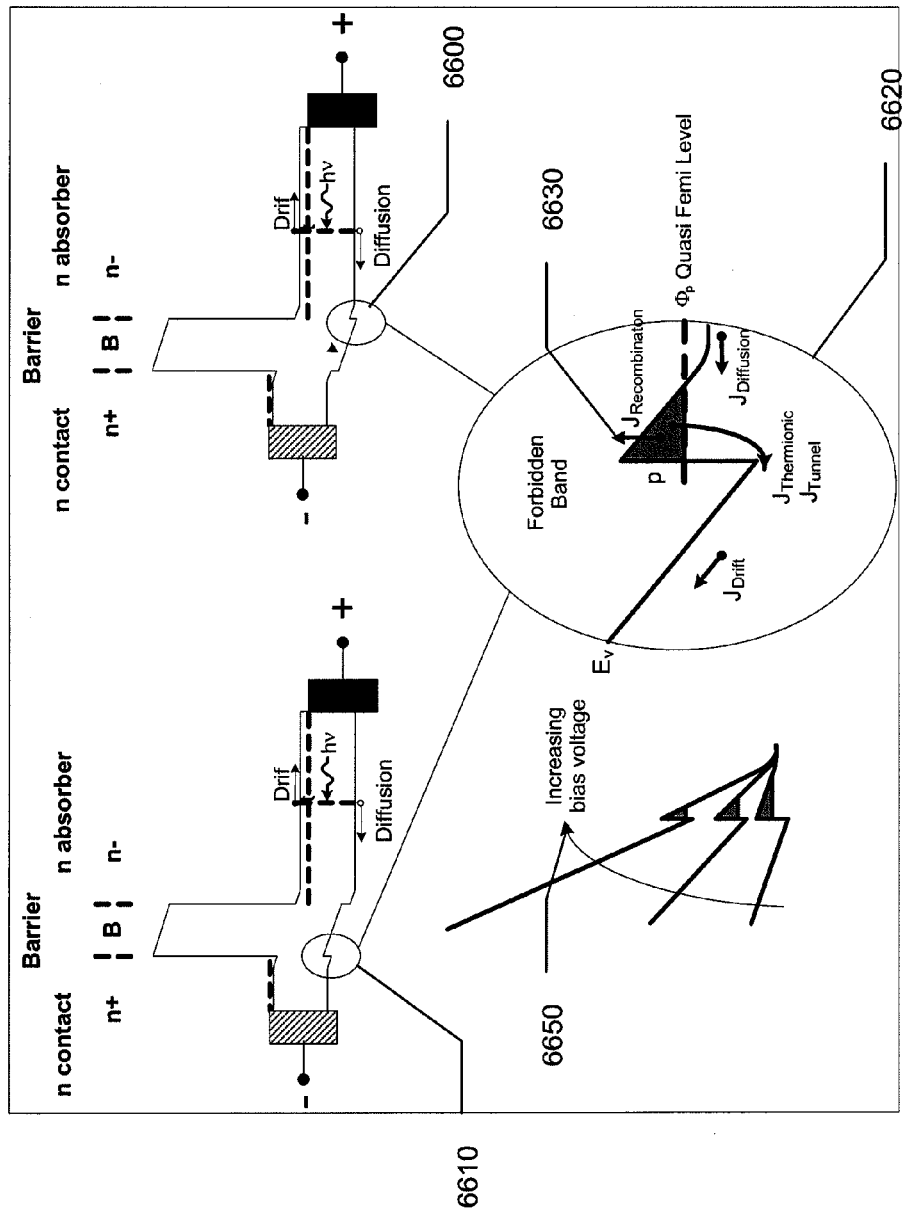
FIG. 6g shows an energy-band diagram with a non-graded Barrier in a barrier-type photo-detector.

FIG. 6g presents an example of energy band diagrams associated with an embodiment of an nBn Barrier-type detectors with ungraded Barriers. In the example diagrams, a band offset 6610, 6600 requiring a small bias voltage for minority carrier transport is illustrated. The abrupt discontinuity in the valance band creates a notch at the interface 6620 that may arise in charge storage and the loss of quantum efficiency to undesired carrier combination 6630. Increasing the bias voltage 6650 may decrease the size of the notch 6620 but will not eliminate carrier recombination or charge storing.

Figure 6H:
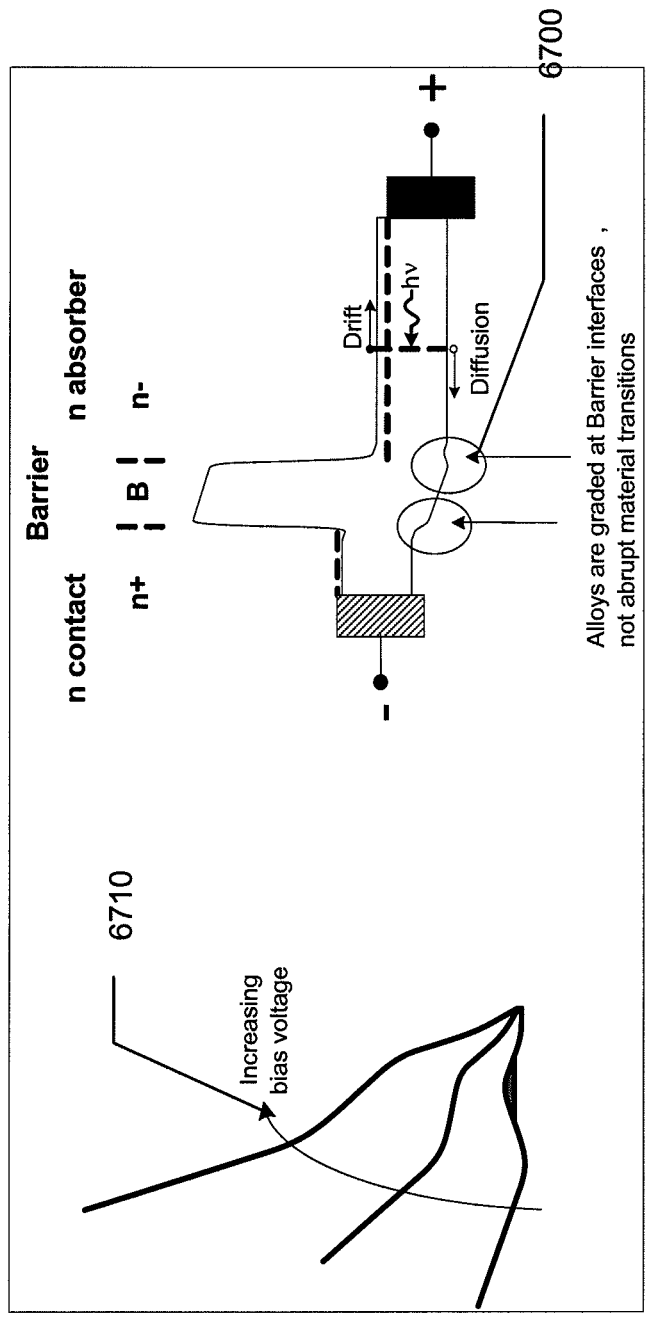
FIG. 6h shows an energy-band diagram with a graded Barrier in a barrier-type photo-detector.

FIG. 6h presents an example of an energy band diagram associated with an embodiment of an nBn Barrier-type detector with a graded Barrier. In the example, the diagram includes a band offset 6700 which can require a small bias voltage for minority carrier vertical transport in the pixel region. While both graded and ungraded small-valence-band offsets avoid transport into the inter-pixel regions, the grading of the Barrier band interface can eliminate the notch at the interface and may avoid the undesired carrier storage and recombination as increased bias voltages 6710.

With respect to inter-pixel carrier transport, the lateral p-n junctions can reduce or prevent the lateral transport of majority carriers. Embodiments of such a back-to-back diode structure can be used as current blocking configurations, where any bias is dropped across the rectifying diode. An example of an embodiment having lateral carrier blocking through p-n junctions in layer 2 is given in FIG. 6i. In the embodiment shown, a lateral energy band diagram associated with an embodiment of an nBn structure where p dopants 6280 have been introduced into layer 2 6830 to delineate the pixels is depicted. The blocking junction region 6800 of layer 2 is a p-doped region whereas the pixel region of layer 2 6830 is n-doped, creating back-to-back p-n junctions 6810 which block lateral transport of minority carriers between pixel regions. A similar effect can be accomplished by using n-doped blocking junctions and p-doped pixel regions.

Penetrating Blocking Junction Embodiments

In yet another embodiment of a blocking junction, FIG. 7a shows Barrier-type structure with modified regions 7000 that include "plugs" of p+ doped blocking barriers 7010 which are inserted into n doped "hole repulsion" junctions 7020 that penetrate through the low doped or "n–" layer 2 7080, the Barrier 7040 and into the n– layer 1 7080. In layer 2 7030 the n–/n homojunction creates a built-in field that will repel the minority carriers while the back-to-back n/p+ junction can impede lateral current flow between pixels. The n–/n homojunction beneath the Barrier can prevent minority carrier injection from layer 1 7080 into the modified regions 7000 in layer 2. Such embodiments can permit either layer 1 or layer 2 to function as a photo-absorbing layer, allowing for 2-color operation when layer 1 and layer 2 have different band gaps. Alternate embodiments can employ different doping combinations (such as n+ doped "plugs" in p-doped penetrating junctions).

As can be seen from the embodiment depicted in FIG. 7a, there may be four carrier pathways at work in such a structure.

The pathway associated with section a-a exhibits an energy band configured for the "normal" nBn minority carrier pathway through the Barrier layer. The pathway associated with section c-c exhibits an energy band configured for a back-to-back blocking junction pathway that impedes lateral carrier transport across pixels. The pathway associated with section b-b exhibits an energy band configured for a blocking p-n junction "plug" inside a minority carrier repelling homojunction well. The pathway associated with section d-d exhibits an energy band configured for an n/n− homojunction pathway that may repel minority carriers without blocking lateral conduction in layer 2.

Figure 7B:
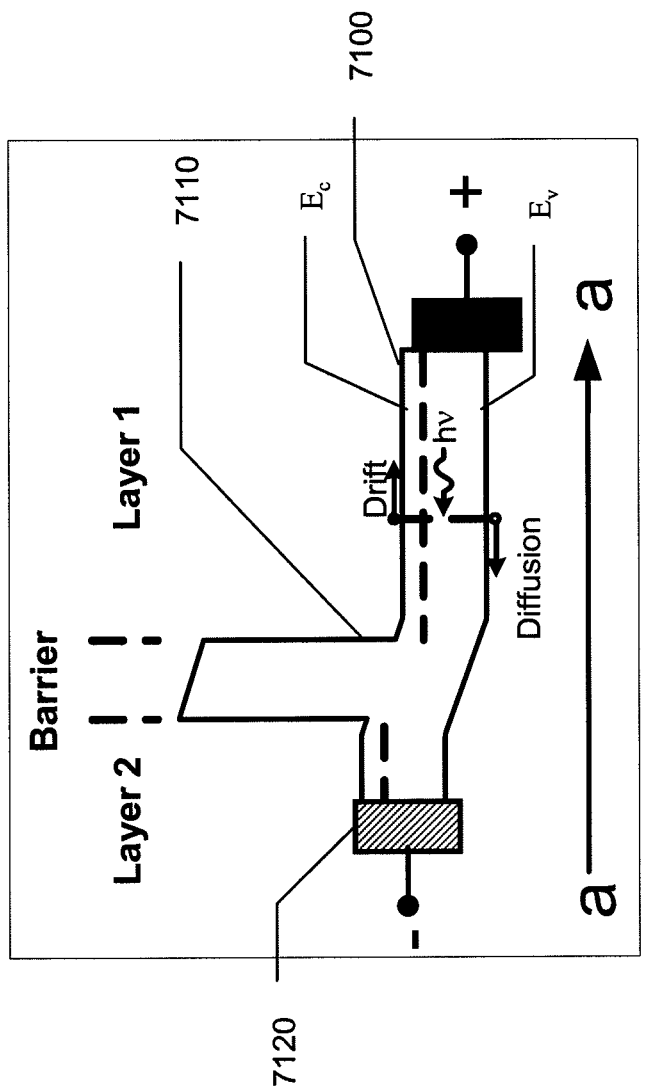
FIG. 7b shows an energy-band diagram in a pixel region of a barrier-type photo-detector.

An example energy band for transport along section a-a in the pixel region is shown in FIG. 7*b*. This diagram illustrates the case of minority carrier flow from Layer 1 7100 across the Barrier 7110 into Layer 2 and collected in the pixel contact 7120. The embodiment shown operates in a manner similar to that discussed with respect to FIG. 5*b*.

With respect to lateral carrier diffusion across pixels, a plugged penetrating junction embodiment may prevent transport of both majority and minority carriers as shown in FIG. 7*c*. The diagram illustrates an exemplary lateral energy band diagram for a penetrating-blocking-junction nBn structure where p+ plugs 7230 have been introduced into n wells 7240 in an n− layer 2 7260.

Because of the p+ doped plugs of the embodiment shown, there are back-to-back p+n junctions 7210 that impede majority carrier transport laterally through the layer. In the embodiment shown, the delineated pixel region 7260 is n− doped while the penetrating junctions 7240 are n doped. The n−/n junctions 7200 reduce or prevent injection of minority carriers into the modified regions represented by the penetrating junctions, thereby eliminating inter-pixel cross talk associated with trapping of minority carrier generated in layer 1 in the non-pixel region in layer 2. In addition, in the case of using layer 2 as the photoabsorbing layer, for example in two-color operation, the n−/n lateral junction ensures that photogenerated carriers are transported across the Barrier and not trapped in the non-pixel region. This is illustrated by the downward dips in the valance band at the pixel edges in FIG. 7*c*, which are absent in the valance band in FIG. 6*c*.

In some instances, embodiments of an associated device fabrication process can advantageously utilize self-aligned masking techniques, further improving production yields and reducing production costs. Embodiments of such self-aligned techniques can rely on defining an opening for ion implantation or diffusion, followed by isotropic deposition of additional masking material which may be removed from the window with an anisotropic vertical etch such as reactive ion etching. The resulting window opening can be reduced approximately by the thickness of the additional masking material, providing self aligned control for the blocking junction and well doping lateral profiles.

Figure 7D:
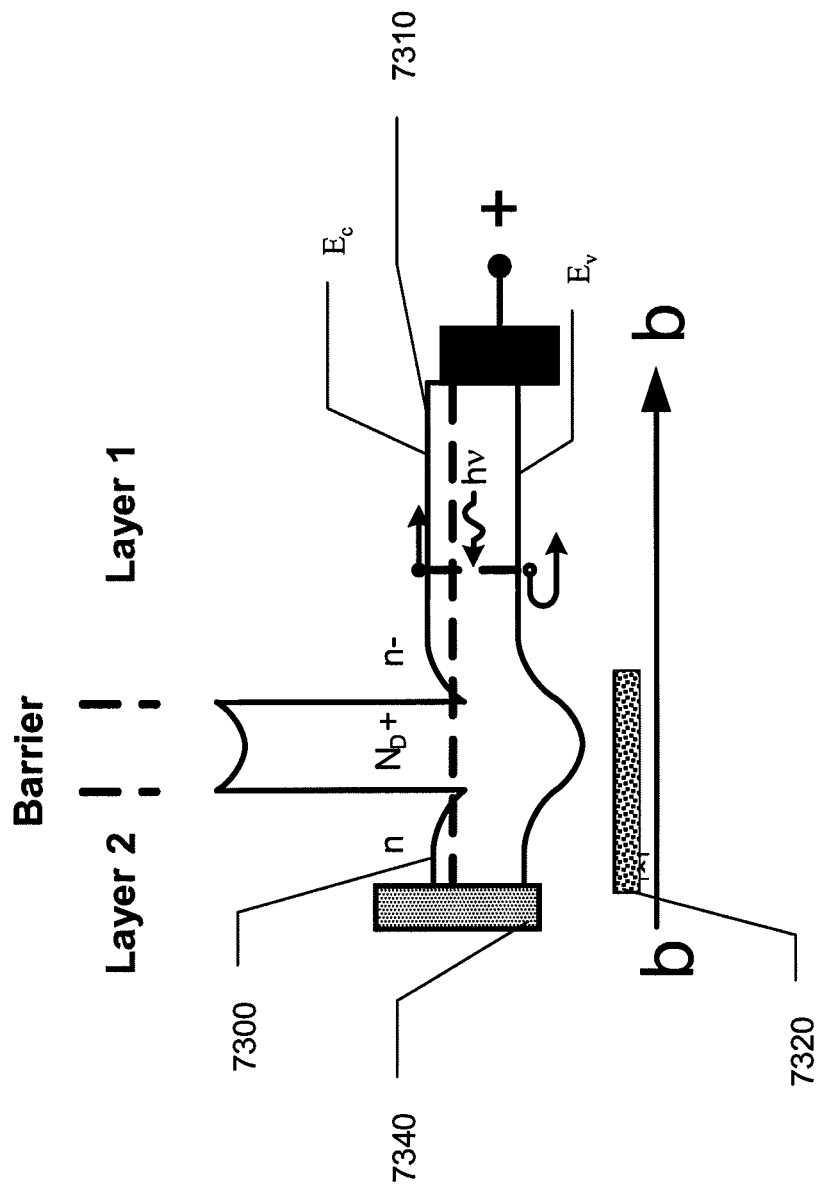
FIG. 7d shows an energy-band diagram in a non-pixel region of a barrier-type photo-detector.

An embodiment showing blocking of unwanted minority carriers through the Barrier for a penetrating junction is depicted in the energy band diagram b in FIG. 7*d*. The figure presents a vertical energy band diagram for a penetrating-blocking-junction nBn structure in the region where n wells 7320 have been introduced in the n− layers 1 7300 and 2 7310.

As can be seen in the diagram, the depicted embodiment of a penetrating junction creates a depletion zone 7340 at the top of layer 1, reducing or preventing minority carrier diffusion and recombination in the lateral junction region and thereby improving quantum efficiency. Such an embodiment avoids surface traps in the pixel sidewalls in layer 2 that would otherwise be associated with a non-penetrating ion-damaged blocking layer embodiment or with capture of photogenerated minority carriers in a simple blocking junction embodiment. A penetrating junction embodiment can provide improved pixel isolation as it can effectively prevent the transport of minority carriers from the absorber that are not associated with a pixel region on the delineated layer.

Figure 7E:
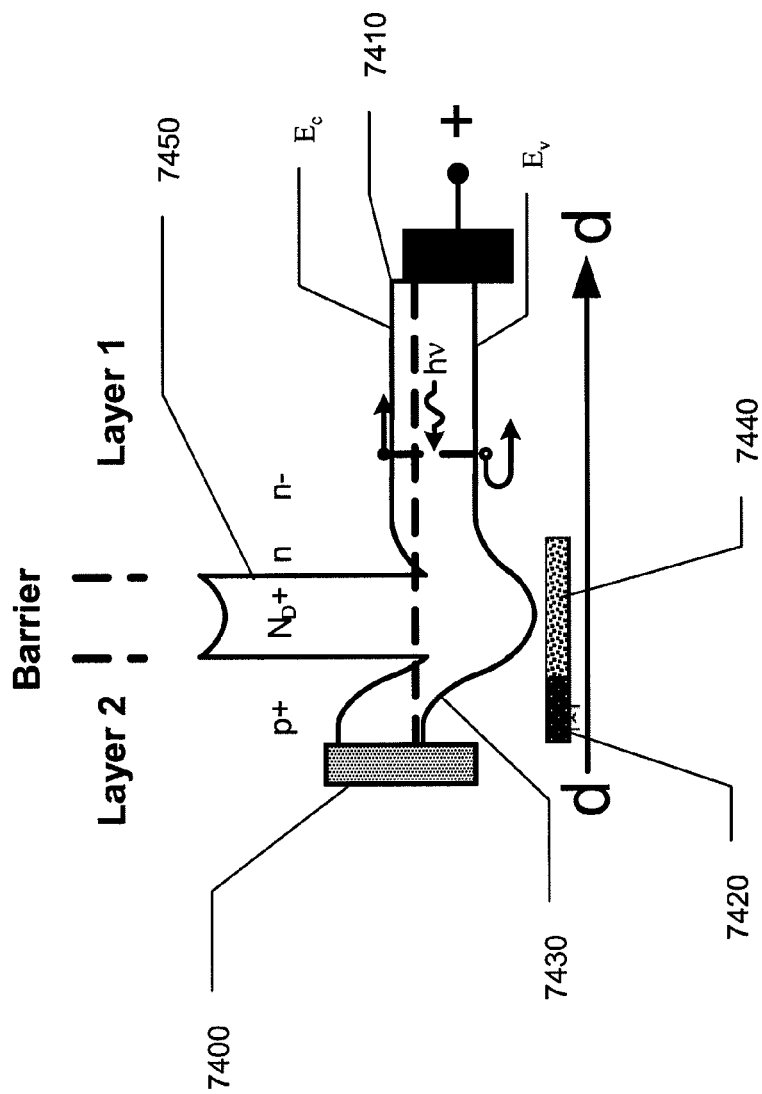
FIG. 7e shows an energy-band diagram in a non-pixel region of a barrier-type photo-detector.

Blocking of vertical minority carrier transport through the Barrier for a penetrating junction embodiment is depicted in the energy band diagram of FIG. 7*e*. This figure shows an exemplary vertical energy band diagram for a penetrating-blocking-junction nBn structure in the region where p+ "plugs" 7420 are placed within layer 2 7430, where n wells 7440 have been introduced in the n− layers 1 7410 and 2 7430.

As shown in the diagram, minority carriers can be blocked by the depletion zone 7400 created in the n/n− junction surrounding the p+ doped plug in the penetrating junction. The minority carriers are repelled from the Barrier 7450 and the blocking layer 7440 in the modified regions.

In another variation layer 2 can be grown such that it is not laterally conducting. Further variations on such growth techniques can include growing a p-n junction in layer 2 and modifying the depleting layer in the pixel region.

Many additional combinations can be used to delineate pixel regions by laterally modifying the photodetector layers using combinations of the above disclosures. Other variations on the techniques and structures discussed herein can include using partially etched layers above the Barrier in combination with techniques for lateral modification of the layers' properties. In further variations, stop etch layers in the narrow gap material can be incorporated to facilitate the selective etching. In yet further variations, etching or layer modification can be combined with epitaxial re-growth techniques to achieve similar results.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

The invention claimed is:

1. A photo-detector comprising:
   a first layer having predetermined majority and minority carrier types with corresponding energy bands;
   a Barrier comprising a semiconductor with a Barrier energy gap and corresponding conduction and valence bands, a first side of said Barrier adjacent a first side of said first layer;
   a second layer having the predetermined majority and minority carrier types with a second layer energy gap, said second layer being adjacent a second side of said Barrier opposing said first side;
   wherein the Barrier conduction and valance band edges are aligned with respect to the first and second layer energy bands so as to allow minority carrier current flow while blocking majority carrier current flow between the first and second layers;
   wherein the second layer is delineated into pixel regions and non-pixel regions that separate the pixel regions from each-other leaving at least part of the Barrier as a physically continuous layer such that the first side of said Barrier laterally extends beyond at least one pixel region;
   where the non-pixel regions of the second layer impede carrier current flow between pixels;
   where the non-pixel regions include material from the second layer adjacent to the Barrier;

where the non-pixel regions include composite regions having an outer shell of a first doping type and an inner plug of a second doping type;
where the inner plug is fully surrounded by the outer shell; and
where the outer shell extends from the delineated layer, through the Barrier, and into the first layer.

2. The photo-detector of claim 1, where the first layer acts as a photo-absorbing layer and the second layer acts as a contact layer during operation with a bias voltage.

3. The photo-detector of claim 1, where the non-pixel regions include ion-damaged regions and where the ion damage prevents carrier transport through the ion damaged regions.

4. The photo-detector of claim 3, where the ion-damaged regions extend fully through the second layer such that the ion-damaged regions are in contact with the Barrier.

5. The photo-detector of claim 1, wherein second layer materially is partially removed from the non-pixel regions.

6. The photo-detector of claim 3, where the ion damage prevents lateral transport of majority carriers between delineated pixels.

7. The photo-detector of claim 1, where the Barrier is graded at an interface of the Barrier and the first layer such that a material transition from the first layer to the Barrier allows for minority carrier transport through the Barrier without carrier recombination at the interface.

8. The photo-detector of claim 1, where the first layer is graded at an interface of the Barrier and the first layer such that a material transition from the first layer to the Barrier allows for minority carrier transport through the Barrier without carrier recombination at the interface.

9. The photo-detector of claim 1, where the Barrier valence band is slightly mismatched with respect to the layer 1 energy band, thereby reducing carrier transport across interface of the Barrier and those portions of the first layer corresponding to the non-pixel regions.

10. The photo-detector of claim 1, where the second layer is n− doped, the first doping type is n type, and the second doping type is p+ type.

11. The photo-detector of claim 1, where a junction formed at an interface of the plug and the shell prevents lateral transport of majority carriers between pixel regions in the delineated layer.

12. The photo-detector of claim 1, where the outer shell creates a localized homojunction that acts as a minority carrier barrier in the non-delineated layer at an interface of the shell and the first layer, where the homojunction prevents vertical transport of minority carriers through the Barrier and into the non-pixel region.

13. The photo-detector of claim 10, where a p-n junction formed at an interface of the plug and the shell prevents lateral carrier transport within the second layer.

14. The photo-detector of claim 1, where the second layer acts as a photo-absorbing layer and the first layer acts as a contact layer during operation with a reverse bias voltage.

15. The photo-detector of claim 1, where a forward voltage bias or a reverse voltage bias is applied to the photo-detector during operation; and where the first layer acts as a photo-absorber and the second layer acts as a contact layer under the forward bias and the second layer acts as the photo-absorber and the first layer acts as the contact layer under the reverse bias.

16. The photo-detector of claim 15, where the first layer has a first band-gap associated with a first spectral band and the second layer has a second band-gap associated with a second spectral band such that the first spectral band is detected during forward bias operation and the second spectral band is detected during reverse bias operation.

17. The photo-detector of claim 16, where the first band-gap is larger than the second band-gap and the photo-detector is configured in a backside illuminated mode providing two-color operation.

18. The photo-detector of claim 16, where the second band-gap is larger than the first band-gap and the photo-detector is configured in a front-side illuminated mode providing two-color operation.

19. The photo-detector of claim 1, where the pixel regions include ion-damaged semiconductor material, and where the ion damage imparts electrically conductive and carrier-bearing properties to the semiconductor material.

20. The photo-detector of claim 1, wherein the photo-detector is an infra-red photodetector.

* * * * *